(12) United States Patent
Haigh (10) Patent No.: US 8,270,152 B2
(45) Date of Patent: Sep. 18, 2012

(54) METHOD AND APPARATUS FOR STORAGE OF CABLES

(75) Inventor: David C. Haigh, Havant (GB)

(73) Assignee: Xyratex Technology Limited, Havant (GB)

( * ) Notice: Subject to any disclaimer, the term of this patent is extended or adjusted under 35 U.S.C. 154(b) by 223 days.

(21) Appl. No.: 12/859,613

(22) Filed: Aug. 19, 2010

(65) Prior Publication Data

US 2012/0044627 A1    Feb. 23, 2012

(51) Int. Cl.
*G06F 1/16* (2006.01)

(52) U.S. Cl. .............. 361/679.33; 385/136; 242/563; 174/107

(58) Field of Classification Search .......... 385/135, 385/136, 112, 110, 101, 111, 100; 242/407, 242/373, 578.2, 388.6, 563, 588.3, 388.1; 33/527, 228, 576, 756, 701; 174/24, 107, 174/110 PM, 120 R, 68.1, 50, 75 C; 361/679.33, 361/679.37, 679.46, 679.31, 679.54, 679.52, 361/679.39, 679.22, 679.4, 679.38
See application file for complete search history.

(56) References Cited

U.S. PATENT DOCUMENTS

| 6,014,713 | A | 1/2000 | Agnew et al. |
| 6,511,009 | B1 | 1/2003 | Harrison et al. ........... 242/388.5 |
| 6,640,041 | B2 | 10/2003 | Ichinari et al. ................ 385/136 |
| 6,915,058 | B2 | 7/2005 | Pons |
| 7,116,883 | B2 | 10/2006 | Kline et al. .................... 385/135 |
| 7,627,218 | B2 | 12/2009 | Hurley |
| 2002/0118944 | A1* | 8/2002 | Burns et al. .................... 385/135 |
| 2008/0164364 | A1* | 7/2008 | Kaltman ....................... 242/407 |
| 2011/0259992 | A1* | 10/2011 | Newton, Jr. .................. 242/407 |

FOREIGN PATENT DOCUMENTS

EP    0 519 210    12/1992

* cited by examiner

*Primary Examiner* — Hung Duong
(74) *Attorney, Agent, or Firm* — Pillsbury Winthrop Shaw Pittman LLP (57) ABSTRACT

There is provided a method and apparatus for storage of cable, comprising: a cable reel, said cable reel being rotatable about an axis and having a surface spaced from said axis, said surface being arranged to store wound cable thereon, the cable reel further comprising: a first receiving portion for receiving a first part of the cable; a second receiving portion for receiving a second part of the cable; and a guide for guiding the cable between the first and second receiving portions, wherein the guide is arranged to guide the cable along a path extending in three dimensions.

20 Claims, 10 Drawing Sheets

METHOD AND APPARATUS FOR STORAGE OF CABLES

The present invention relates to a method of, and apparatus for, storage of cables. More particularly, the present invention relates to a storage reel arrangement for storage of communication cable.

Communication cables are used in many electronic systems to connect, for example, components in a computing system. Both conventional metal cables and fibre optic cables are widely used.

Fibre optic cables are commonly found in communications systems for carrying information between components in a computer network. A typical example may be the use of optical fibres in an optical cross-connect system for a communications network.

In many situations, it is not space-efficient or practical to have a large amount of loose cabling between two devices. Therefore, it is useful to coil cables on, for example, a spool in order to enable efficient and tidy storage of these cables.

Commonly, fibre optic cable comprises a core, cladding, a buffer layer and an outer jacket. The core is arranged to transmit optical signals and is typically formed from glass for high bandwidth optical transmission of information, although in some cases plastic may be used. The surrounding cladding is provided to maintain the light within the core and generally comprises a material having a lower refractive index than the core in order to maintain total internal reflection conditions within the core, and so prevent leakage of light from the core. The buffer layer and outer jacket are provided to protect the core, and cladding from damage from the external environment and to provide additional optical shielding.

Typically, due to the construction of fibre optic cables, they can suffer only a particular amount of deformation due to bending before degradation occurs. For some optical fibres, a degree of bending of the fibre may result in some leakage of light from the fibre due to the critical angle for total internal reflection being exceeded. However, a larger issue is that the fibre core can become micro-fractured and damaged by excessive bending. These cracks and fractures can propagate through the cable, leading to a loss in transmission through the cable. Ultimately, the cable will degrade to such an extent that it will require replacement. Therefore, it is important to avoid damaging the fibre through excessive bending.

For such cables, a minimum bend radius is defined. If the cable is bent to circumscribe a part-circle, the radius of that circle must not be less than the minimum bend radius otherwise damage will occur to the cable. In other words, the minimum bend radius defines the tightest curve that the cable can be bent to form without suffering damage. Whilst the minimum bend radius is of particular importance in the handling of fibre optic cables, it is also applicable to other cable designs; for example, some types of coaxial cable or other cables comprising semi-rigid internal components.

As set out above, the minimum bend radius of a particular cable places a constraint on the minimum diameter of a conventional cable reel because the minimum diameter of a cable reel must not be less than twice the minimum bend radius of the cable.

However, in many instances, the cable reel is desired to be stored between the two components connected by the cable. In this arrangement, the cable will enter the reel in one direction and exit the reel in the same direction. In some situations, the components will be required to move relative to one another to enable, for example, access or repair. Consequently, the reel may need to wind/unwind cable in both directions. It may even be required to move with the movable component.

Such a situation may arise, for example, where a movable drawer containing hard disk drives (HDDs) is connected to a fixed circuit board or other fixed apparatus in the enclosure by a cable or cables. The cable connections must be maintained for all positions of the drawer. When the drawer is fully withdrawn a certain length of cable is clearly required to maintain connections. When the drawer is in the fully closed position, the cable must be wound up without tangling or fouling other objects in the enclosure.

However, in an arrangement whereby the cable is wound onto a cable reel in both directions, the cable must enter and exit the cable reel substantially perpendicular to the axis of the cable reel. Further, to facilitate winding, the cable must enter the cable reel at a top part thereof and exit at a lower part thereof, or enter and exit at any diametrically opposite parts.

In order to facilitate this change of position and direction without violating the minimum bend radius of the cable, the cable reel must have sufficient diameter to accommodate an internal S-bend in the cable. Examples of such an internal arrangement are described in U.S. Pat. No. 7,116,883, U.S. Pat. No. 6,511,009, EP-A-0 519 210 and US-A-6,640,041.

Figure 1:
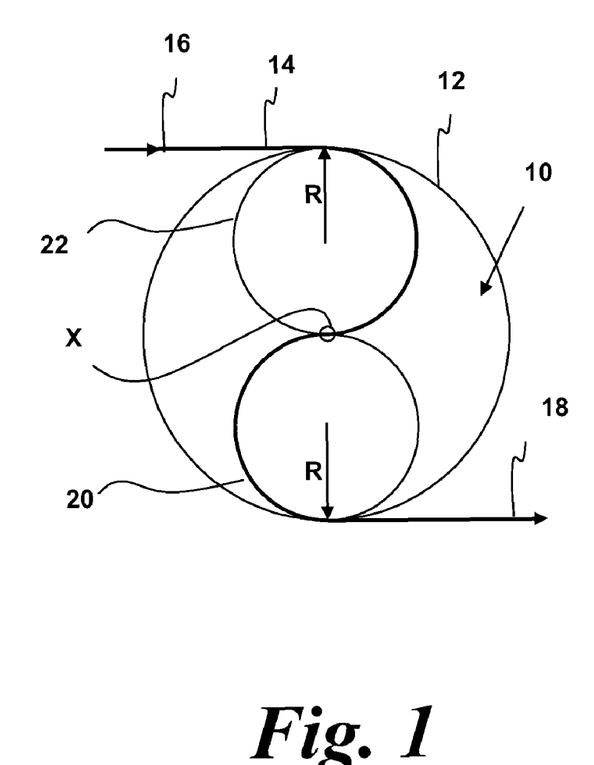
FIG. 1 is a schematic diagram of a conventional cable reel showing the cable in an extended position.
Figure 2:
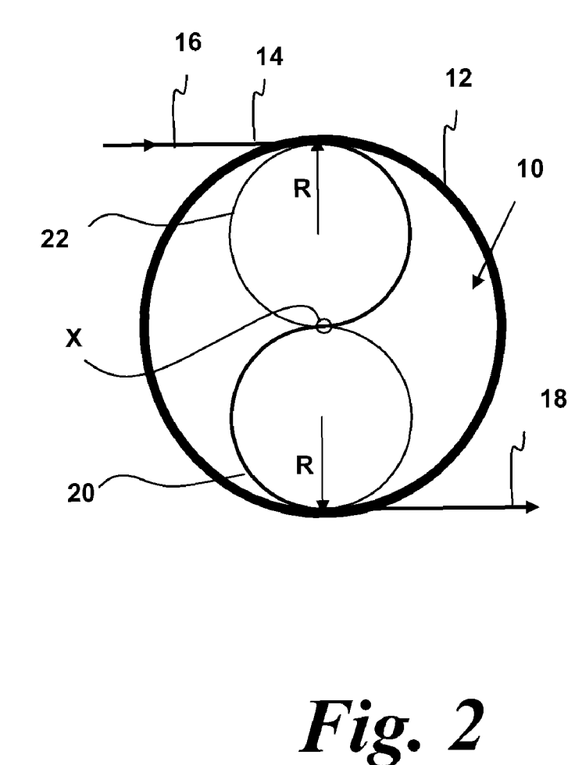
FIG. 2 is a schematic diagram of a conventional cable reel showing the cable in a reeled position.

A schematic example of such an arrangement is shown in FIGS. 1 and 2. In FIGS. 1 and 2, a cable reel 10 is shown. The cable reel 10 is rotatable about an axis X and comprises a reeling surface 12. A cable 14 is connected to the cable reel 10 and comprises a first portion 16 which enters the cable reel 10 at an upper portion of the cable reel 10 and a second portion 18 which exits the cable reel 10 at a lower portion thereof.

In between the first and second portions 16, 18 lies a third portion of the cable 14 which passes internally through the interior of the cable reel 10. The third portion 20 is formed into an S-shape within the interior of the cable reel 10 and is guided by a guide 22 formed within the interior of the cable reel 10. The guide 22 is arranged to guide the third portion 20 of the cable 14 into an S-shape with a radius of curvature R equal to, or greater than, the minimum bend radius of the cable 14.

FIG. 1 shows the cable reel 10 with the cable 14 unwound. FIG. 2 shows the cable reel 10 with the cable 14 wound onto the reeling surface 12. As shown in FIGS. 1 and 2, the requirement for the S-bend guide 22 with a radius of curvature no less than the minimum bend radius of the cable 14 means that the diameter of the cable reel 10 as a whole (i.e. the distance between opposing reeling surfaces 12) must be at least four times the minimum bend radius.

Whilst the minimum bend radius varies in dependence upon the cable type, the smallest minimum bend radius for a modern fibre optic cable is approximately 5 mm. Therefore, in this configuration, the minimum diameter of the cable reel 10 must be at least 20 mm for a minimum bend radius of 5 mm. This may still be too large for some applications where only a small space is available for a cable reel.

Therefore, known cable reel arrangements suffer from a technical problem that the size of the cable reel cannot be reduced below a minimum of four times the minimum bend radius of the cable to be stored without causing damage to the cable. This requires increased storage space for the cable reel and reduces the amount of other equipment which may be integrated into a particular area or enclosure.

According to a first aspect of the present invention, there is provided a storage reel arrangement for storage of cable, comprising: a cable reel, said cable reel being rotatable about an axis and having a surface spaced from said axis, said surface being arranged to store wound cable thereon, the cable reel further comprising: a first receiving portion for receiving a first part of the cable; a second receiving portion for receiving a second part of the cable; and a guide for guiding the cable between the first and second receiving portions, wherein the guide is arranged to guide the cable along a path extending in three dimensions.

By providing such an arrangement, the third dimension can be utilised to define an optimum and more compact path for the cable on a cable reel. This enables a smaller cable reel to be provided without exceeding the minimum bend radius of the cable in question. By providing a smaller cable reel, a more compact installation is possible; reducing the footprint of the attached equipment and providing additional storage space for components of the system into which the cable reel is integrated. A communication cable is one type of suitable cable that could be used.

In one embodiment, the guide is curved. In a further embodiment, the guide comprises a plurality of curved portions, each portion being curved in a different direction.

In one variation, each curved portion lies in a plane. In other words, each curved portion is planar. In a further variation, the plane of each curved portion lies at an angle to the planes of the other curved portions.

In one arrangement, at least two curved portions are provided. In a variation, at least four curved portions are provided.

In a variation, each curved portion has a radius of curvature which is equal to or greater than the minimum radius of curvature of said cable.

In one embodiment, said guide comprises at least one guide channel. In a variation, said guide channel comprises a groove.

In another variation, said guide channel is formed in a spherical surface. In a further variation, said spherical surface comprises two spheres adjacent one another.

In an arrangement, said guide comprises a tube, said cable being passed through said tube.

In an alternative arrangement, said guide forms an end cap on said cable reel.

In one configuration, said cable comprises a fibre optic cable.

According to a second aspect of the present invention, there is provided a storage device for containing electronic components, said storage device comprising: a frame; and at least one drawer movable with respect to said, frame; said frame comprising a first device and said drawer comprising a second device, said first and second electronic devices being connected by at least one communication cable, wherein said communication cable is stored on a storage reel arrangement according to the first aspect.

In one embodiment, said first device comprises an optical printed circuit board and said second device comprises at least one data storage device.

In a further embodiment, the or each data storage device comprises a hard disk drive.

According to a third aspect of the present invention, there is provided a storage reel arrangement for storage of cable, comprising: a cable reel, said cable reel being rotatable about an axis and having a surface spaced from said axis, said surface being arranged to store wound cable thereon, the cable reel further comprising: a first receiving portion for receiving a first part of the cable; a second receiving portion for receiving a second part of the cable; and a guide for guiding the cable between the first and second receiving portions, wherein the guide is arranged to guide the cable along a path extending in three dimensions such that the path taken by the guide can be resolved into components parallel to and perpendicular to the axis of rotation of the cable reel.

According to a fourth aspect of the present invention, there is provided a method of storing cable, comprising: providing a cable reel, said cable reel being rotatable about an axis and having a surface spaced from said axis, said surface being arranged to store wound cable thereon, the method further comprising: receiving a first part of the cable at a first receiving portion of said cable reel; receiving a second part of the cable at a second receiving portion of said cable reel; and guiding the cable between the first and second receiving portions, along a path extending in three dimensions.

Embodiments of the present invention will now be described in detail with reference to the accompanying drawings, in which.

Figure 3:
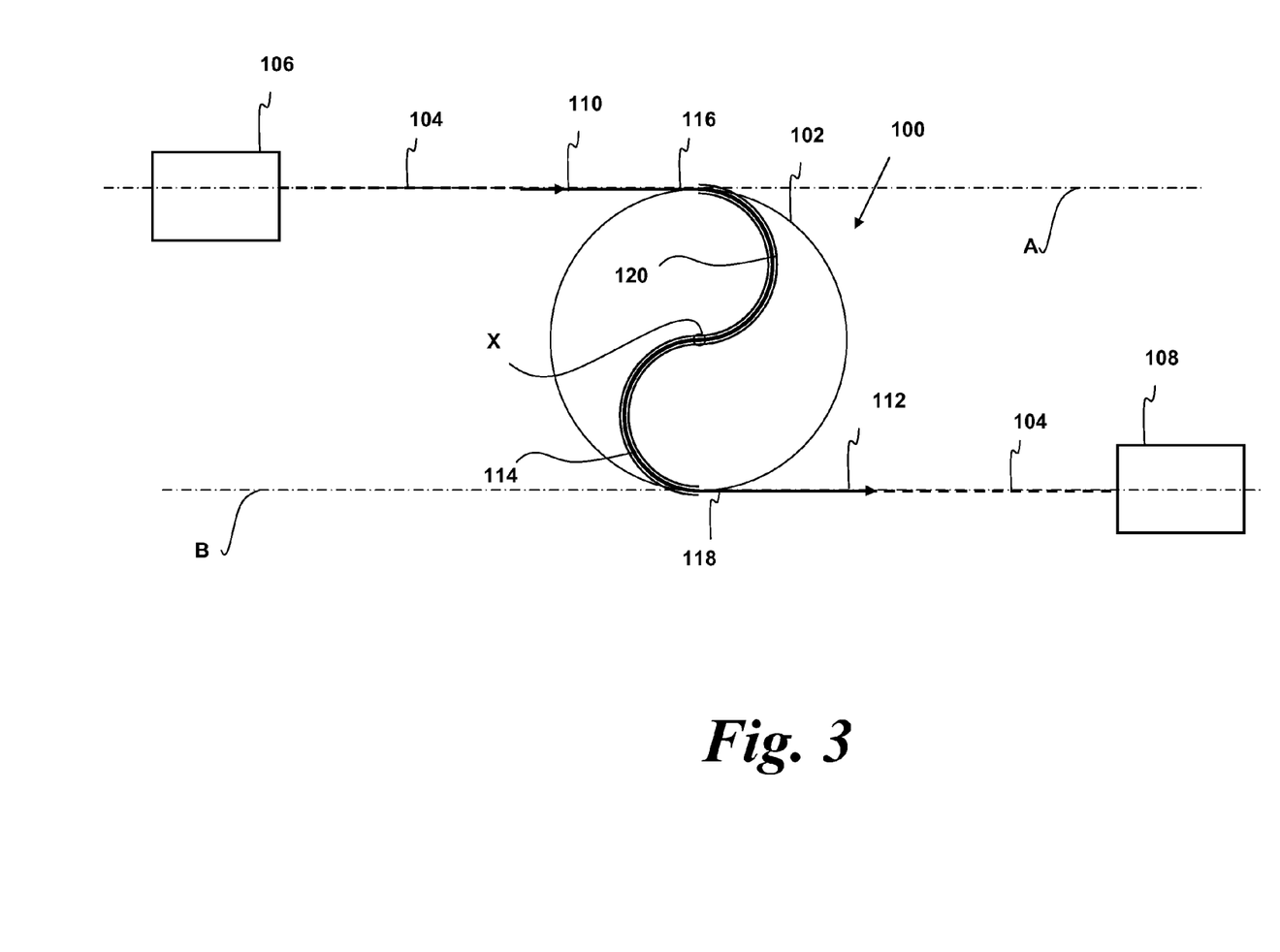
FIG. 3 is a schematic diagram of a cable reel according to an embodiment of the invention.

FIG. 3 shows a cable reel 100 according to an embodiment of the invention. The cable reel 100 is rotatable about an axis X and comprises a reeling surface 102. In this embodiment, the reeling surface 102 is cylindrical; however, alternative shapes could be used.

A cable 104 is provided. In FIG. 3, the cable 104 is shown unwound. In this embodiment, the cable 104 is a fibre optic cable comprising a glass core surrounded by cladding and a protective buffer and jacket. The cable 104 has a minimum bend radius $R_{min}$ of approximately 5 mm. However, this is not to be taken as limiting and the skilled person would readily be aware that suitable cables may have different minimum bend radii, depending upon the application and structure of the cable.

Further, alternative cable types could be used; for example, alternative optical waveguide cables (for example, plastic core cables, polymer optical fibres (POFs)), coaxial cables, conventional copper cables or other types of cable. The skilled person would be readily aware of alternative types of cable that could be used with the present invention.

The cable 104 is connected at a first end to a first device 106 and at a second end to a second device 108. The first and second devices 106, 108 may comprise any suitable devices; in general, the devices 106, 108 will comprise electronic or computing devices. For example, the first device may comprise a fixed controller unit and the second device may comprise a hard disk drive mounted on a movable drawer as will be described later.

The cable 104 is also connected to the cable reel 100 and comprises a first portion 110, a second portion 112 and a third portion 114. The first and second portions 110, 112 are located adjacent the cable reel 100. The first portion 110 of the cable 104 meets the cable reel 100 at a first receiving portion 116 of the cable reel 100. The first portion 110 of the cable 104 extends along an axis A at the point where the cable 104 meets the first receiving portion 116. In this embodiment, the axis A is perpendicular to the axis of rotation X of the cable reel 100, although this need not be so.

The second portion 112 of the cable 104 extends away from a second receiving portion 118 of the cable reel 100 along an axis B. In this embodiment, the axis B is perpendicular to the axis of rotation of the cable reel 100, although this need not be so. The axis B is also parallel to, and spaced from, the axis A along which the first portion 110 of the cable 104 extends. Therefore, the first and second portions 110, 112 extend along paths which are parallel to, and spaced from, one another.

The third portion 114 of the cable 104 is located between the first and second portions 110, 112. The third portion 114 is guided by a guide 120 formed on the cable reel 100. The third portion 114 is formed into a three-dimensional S-shape by the guide 120 formed on the cable reel 100. The guide 120 is arranged to guide the third portion 114 of the cable 14 into an S-shape in three dimensions with a radius of curvature which at no point is less than the minimum bend radius of the cable 14.

In order to preserve the integrity of the cable 104 and to maximise the efficient use of available space for cable storage, it is desirable for the guide 120 to meet certain design constraints.

Firstly, the cable 104 must not be twisted excessively. Secondly, the cable 104 must meet the first receiving portion 116 perpendicular to the axis of rotation X, and thirdly the cable must leave the second receiving portion 118 perpendicular to the axis of rotation X and directly below the first receiving portion 116. Faced with these constraints, conventional practice is to provide a planar S-shaped guide (as shown in FIGS. 1 and 2) lying in a plane perpendicular to the axis of rotation X in order to avoid twisting or bending of the cable.

Consequently, the conventional cable reel 10 shown in FIGS. 1 and 2 has a minimum diameter sufficient to accommodate the planar S-shaped guide 22 lying in a plane perpendicular to the axis of rotation X. Therefore, the minimum diameter of a conventional cable reel 10 is necessarily four times the minimum bend radius of the cable, or $4R_{min}$.

The inventor of the present invention has found an approach to avoid this limitation. In the present invention, an effectively larger radius of curvature is obtained by using the third dimension instead of a conventional two-dimensional guide.

As is the case for the conventional cable reel 10, at no point can the radius of curvature be less than the allowed minimum. By applying this, together with the constraints listed above, a three dimensional guide can be devised which enables the diameter of the cable reel to be reduced.

Since the first and second portions 110, 112 of the cable 104 are required to extend parallel to one another and in the same direction, two curves are required (as shown above for the S-bend). Additionally, through consideration of the implications of a varying radius of curvature, it can be shown that a circular shape for the each curved part of the guides is the optimum configuration for packaging without exceeding the maximum allowed curvature. Therefore, the optimum configuration comprises a guide having two arc-shaped parts in which the radii of curvature are the same for each arc.

The optimum path is similar to one turn of a helix. However, because the lead angle of a helix is not zero, the helix will not be tangential at the first and second receiving portions 110, 112, which would cause a discontinuity. Therefore a true helical path cannot be used.

Figures 4, 5, 6:
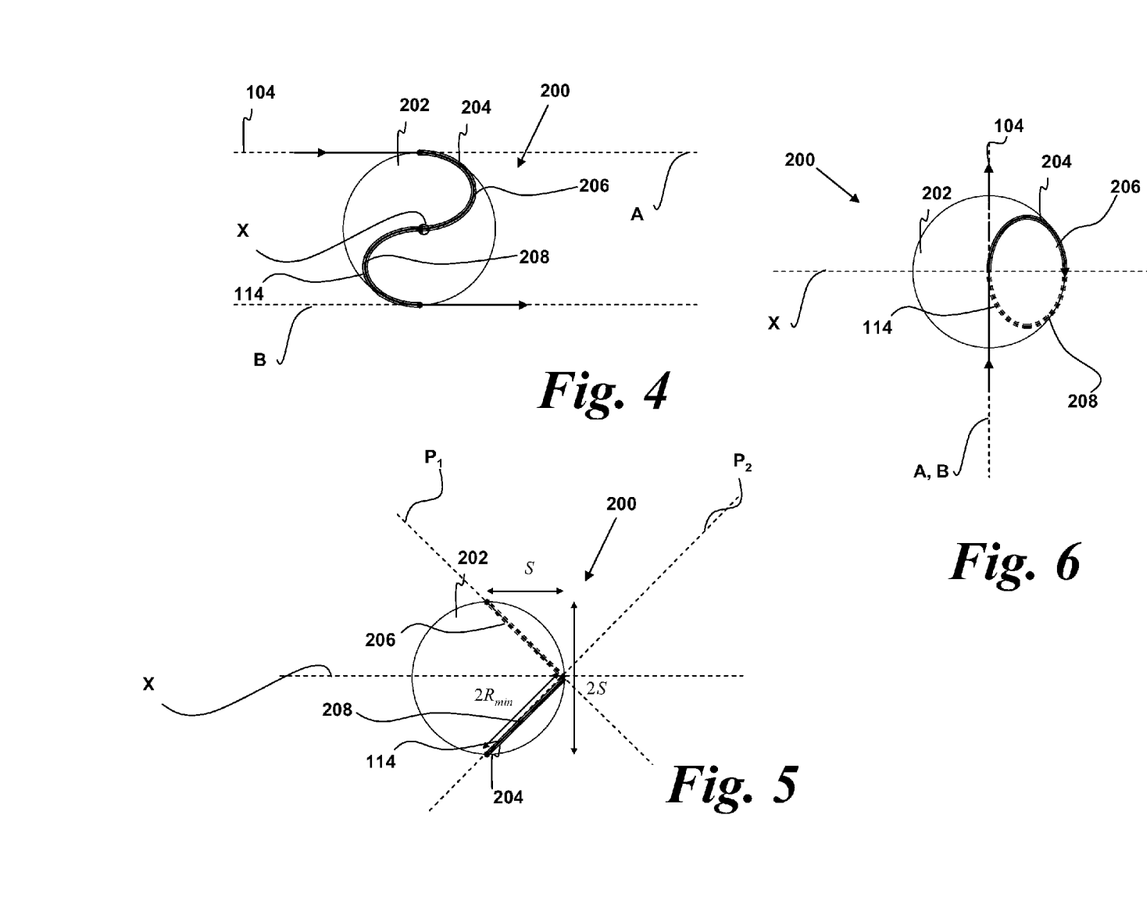
FIG. 4 is a schematic diagram of the end of a first embodiment of a guide for use in the cable reel of FIG. 3.
FIG. 5 is a schematic diagram of the side of the guide shown in FIG. 4.
FIG. 6 is a schematic diagram of a plan view of the guide shown in FIG. 4.

FIGS. 4 to 6 show a first embodiment of the present invention in which a guide 200 is provided in the form of sphere 202 comprising grooves 204. The grooves 204 of the guide 200 follow the surface of the sphere 202. FIG. 4 shows an end view of the guide 200 along the axis X (similar to the view of the guide 120 shown in FIG. 3). FIG. 5 shows a side view in a direction along the axes A and B. FIG. 6 shows a top view perpendicular to each the axes X, A and B.

In this embodiment, the minimum bend radius of the cable 104 is $R_{min}$ and the radius of the spherical guide 200 is S. Consequently, the diameter of the cable reel is, at a minimum, 2S.

In this embodiment, the guide 200 is arranged to guide the third portion 114 of the cable 104 along a curved path in three dimensions. In other words, the third portion 114 of the cable follows a three dimensional path. The third portion 114 follows, in Cartesian geometry, a path which may be resolved into components which extend along the axis X as well as perpendicular thereto. As shown in FIG. 5, the grooves 204 comprise two arc-shaped sections 206, 208 each of which are planar when viewed end-on. Arc section 206 lies in a plane $P_1$ and arc section 208 lies in a plane $P_2$. Planes $P_1$ and $P_2$ are not coincident and lie at an angle to one another. In this embodiment, the angle between the planes $P_1$ and $P_2$ is approximately 90°. In this embodiment, the planes $P_1$ and $P_2$ have, in Cartesian geometry, components which extend along the axis X as well as perpendicular thereto. The same applies to axes A and B.

Assuming that each arc has a radius equal to $R_{min}$ for the cable 104, each arc-shaped section 206, 208 has a length (i.e. diameter) when viewed from the side of $2R_{min}$. Given that the arc sections 206, 208 are dimensioned to lie on the surface of the sphere 202 of the guide 200 and the sphere 202 has a diameter 2S, then it follows, from Pythagoras' theorem and with reference to FIG. 5, then:

$$S^2 + S^2 = (2R_{min})^2 \qquad 1)$$

then:

$$S^2 = 2R_{min}^2 \qquad (2)$$

and so:

$$S = R_{min}\sqrt{2} \qquad (3)$$

Therefore, the dimensions of the cable reel 100 incorporating the guide 200 are approximately $2.83R_{min} \times 2.83R_{min} \times 1.41R_{min}$. This is a surprising reduction in size when compared to a conventional cable reel 10 which has dimensions of $4R_{min} \times 4R_{min} \times T$ (where T is the thickness of the cable 104). For applications such as hard disk drive mount units, the height and length (i.e. the size of the end face) of the cable reel is more critical than the width thereof.

Consequently, for example, if the minimum bend radius $R_{min}$ for a modern optical fibre is 5 mm, then a conventional cable reel as shown in FIG. 1 would have a minimum end area of just over 314 mm². However, a cable reel having a guide 200 according to an embodiment of the invention would have a minimum end area of just over 157 mm², a factor of two smaller.

Figure 7:
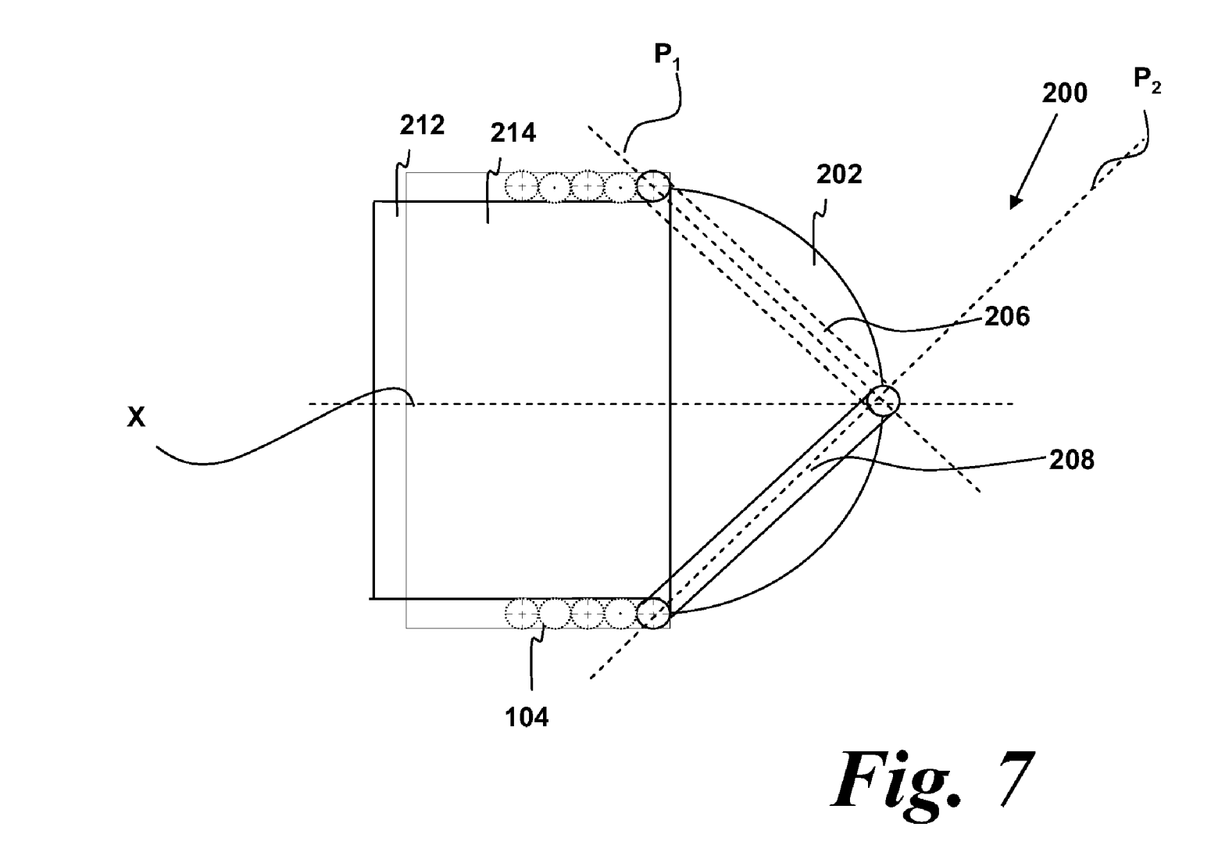
FIG. 7 is a side view of the cable reel of FIG. 3 incorporating the guide shown in FIG. 4.

FIG. 7 is a side schematic view of the semi-spherical guide 200 integrated into the cable reel 100. The grooves 204 of the guide 200 are formed on a hemispherical cap 210 on the end of a cylinder 212. In this embodiment, the relevant minimum radius for consideration is that of the bottom of the grooves 204, which may have a radius equal to that of the cylinder 212 and slightly smaller than other parts of the hemispherical cap 210. The cylinder 212 comprises a surface 214 which acts as a spool around which the cable 104 can be wrapped.

Figure 8:
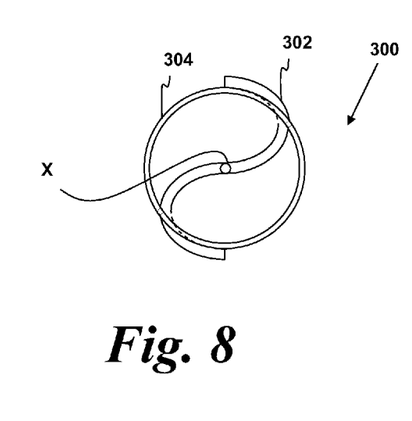
FIG. 8 is a schematic diagram of the end of a second embodiment of a guide for use in the cable reel of FIG. 3.
Figure 9:
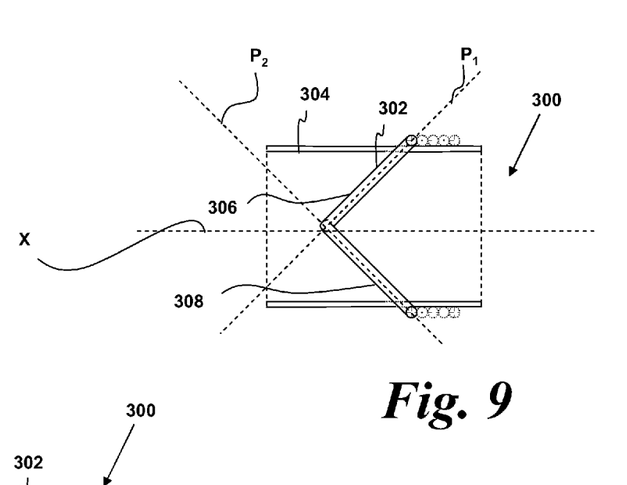
FIG. 9 is a schematic diagram of the side of the guide shown in FIG. 8.
Figure 10:
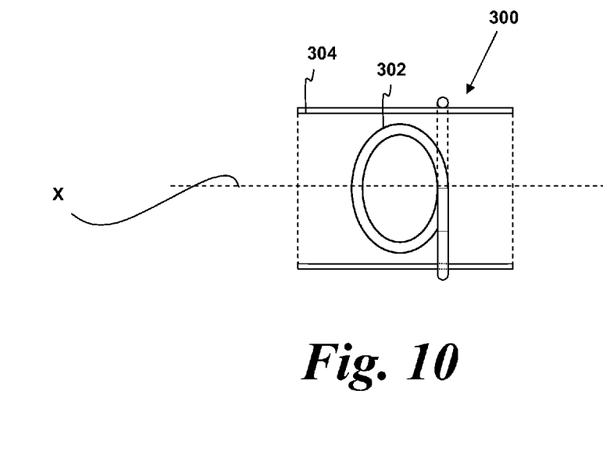
FIG. 10 is a schematic diagram of a plan view of the guide shown in FIG. 8.

FIGS. 8 to 10 show a second embodiment of the present invention in which a guide 300 is provided in the form of a tube 302. FIG. 8 shows an end view of the guide 300 along the axis X (similar to the view of the guide 120 shown in FIG. 3). FIG. 9 shows a side view in a direction along the axes A and B. FIG. 10 shows a top view perpendicular to each of the axes X, A and B.

The tube 302 is arranged to guide the third portion 114 of the cable 104 along a curved path in three dimensions through the interior of a cylinder 304 of the cable reel 100. The first and second receiving portions 116, 118 are formed by the ends of the tube 302.

The tube 302 follows a three dimensional path and is hollow such that it can receive and guide the third portion 110 of the cable 104. As shown in FIG. 9, the tube 302 adapts a similar conformation to the grooves 204 of the first embodiment and comprises two arc-shaped sections 306, 308 each of which are planar when viewed end-on. As shown in FIGS. 8 and 10, the arc portions 306, 308 each have a radius equal to $R_{min}$. Arc section 306 lies in a plane $P_1$ and arc section 308 lies in a plane $P_2$. Planes $P_1$ and $P_2$ are not coincident and lie at an angle to one another.

Figures 11, 12, 13:
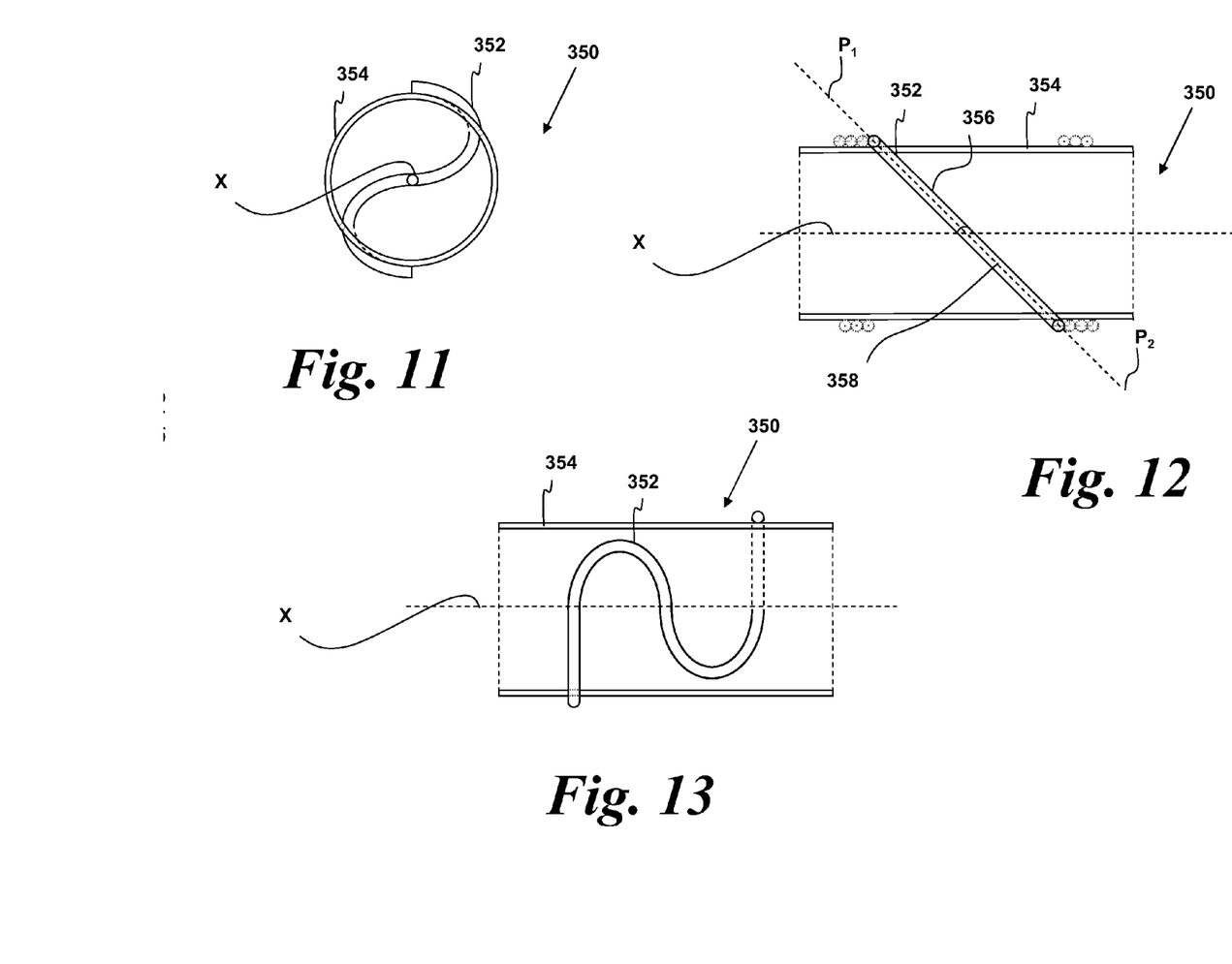
FIG. 11 is a schematic diagram of the end of a third embodiment of a guide for use in the cable reel of FIG. 3.
FIG. 12 is a schematic diagram of the side of the guide shown in FIG. 11.
FIG. 13 is a schematic diagram of a plan view of the guide shown in FIG. 11.

FIGS. 11 to 13 show a third embodiment of the present invention in which a guide 350 is provided in the form of a tube 352. FIG. 11 shows an end view of the guide 350 along the axis X (similar to the view of the guide 120 shown in FIG. 3). FIG. 12 shows a side view in a direction along the axes A and B. FIG. 13 shows a top view perpendicular to each of the axes X, A and B.

In common with the tube 302 of the previous embodiment, the tube 352 is arranged to guide the third portion 114 of the cable 104 along a curved path in three dimensions through the interior of a cylinder 354 of the cable reel 100. The first and second receiving portions 116, 118 are formed by the ends of the tube 352.

In this embodiment, the tube 352 follows a three dimensional path relative to the coordinate axes established by the axes X and A or B and is hollow such that it can receive and guide the third portion 110 of the cable 104. In other words, the path taken by the tube 352 can be, in Cartesian geometry, resolved into a component which extends along the axis X together with two other components which extend perpendicular to the axis X and which are orthogonal to one another. The same may apply to the axes A and B.

As shown in FIG. 12, the tube 352 comprises two arc-shaped sections 356, 358 each of which are planar when viewed end-on. As shown in FIGS. 12 and 13, the arc portions 356, 358 each have a radius equal to $R_{min}$. Arc section 356 lies in a plane $P_1$ and arc section 358 lies in a plane $P_2$. In this embodiment, planes $P_1$ and $P_2$ are coincident with one another and are, as such, overlapping and parallel to one another. In other words, the arc sections 356, 358 lie in the same plane, in contrast to the previous embodiment.

The minimum radius S (and minimum diameter 2S) of the cable reel 100 can be further reduced through the use of multiple arcs in the guide. Mathematically, if the number of arcs used is N, it can be shown that $$S = \frac{2R_{min}}{\sqrt{2 + 2\cos\frac{180}{N}}} \qquad (4)$$

Therefore, the variation in minimum diameter 2S for a cable reel 100 as a function of the number of arc sections in a guide is shown in the following table:

| No. of Arc sections | Minimum Reel Diameter (2S) |
| --- | --- |
| 2 | 2.83 $R_{min}$ |
| 4 | 2.16 $R_{min}$ |
| 6 | 2.07 $R_{min}$ |
| 8 | 2.04 $R_{min}$ |

From this it can be seen that embodiments comprising four arc sections provide a significant further size reduction. Further, provision of additional arc sections in a groove of a guide leads to additional reductions in minimum reel diameter. However, for many applications, four arc sections per guide may be a useful compromise between complexity and size.

A further advantage of a larger number of arc sections per guide N is that the angle between adjacent arc planes is inversely proportional to N. Consequently, as N increases, the angle between adjacent arc planes decreases. Therefore, a greater number of arc sections may be desirable in situations where reduced twisting of the cable 104 between arc sections in a guide is required.

Figure 14:
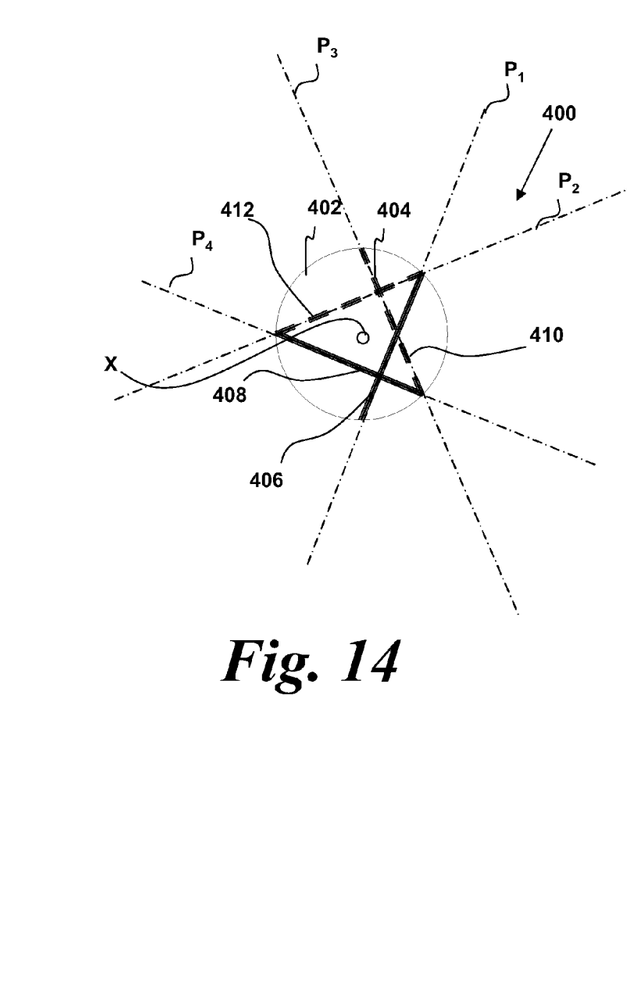
FIG. 14 is a schematic diagram of the end of a fourth embodiment of a guide for use in the cable reel of FIG. 3.
Figure 15:
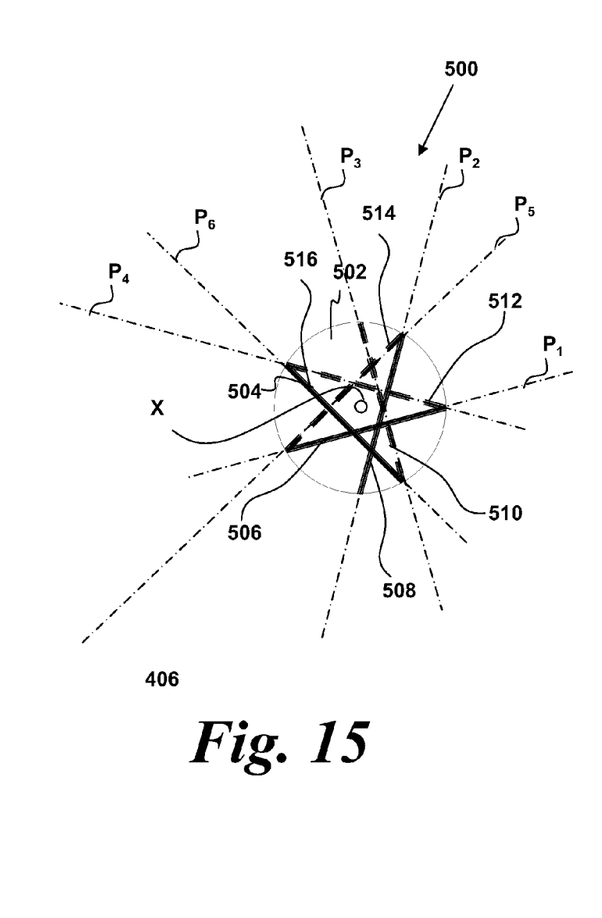
FIG. 15 is a schematic diagram of the end of a fifth embodiment of a guide for use in the cable reel of FIG. 3.

FIGS. 14 and 15 respectively illustrate fourth and fifth embodiments of the present invention which utilise multiple arc sections.

In the fourth embodiment shown in FIG. 14, the guide 400 comprises grooves 404 formed in a spherical surface 402. The grooves 404 comprise four arc sections 406, 408, 410, 412. Each arc section lies in a respective plane $P_1$, $P_2$, $P_3$, $P_4$.

As can be seen from FIG. 14, the arc sections 406-412 overlap. Therefore, the grooves 402 in overlapping regions will need to be deeper in order to accommodate the overlap of the cable 104.

In this configuration, the guide 400 can reduce the minimum diameter of the cable reel 100 to 2.16 $R_{min}$. Consequently, for example, if the minimum bend radius $R_{min}$ for a modern optical fibre is 5 mm, then a cable reel having a guide 400 according to the third embodiment of the invention would have a minimum end area of just over 92 mm². This is a significant reduction over the end area of a conventional cable reel as shown in FIG. 1 which would have a minimum end area of just over 314 mm².

In the fifth embodiment shown in FIG. 15, the guide 500 comprises grooves 504 formed in a spherical surface 502. The grooves 504 comprise six arc sections 506, 508, 510, 512, 514, 516. Each arc section lies in a respective plane $P_1$, $P_2$, $P_3$, $P_4$, $P_5$, and P6.

As can be seen from FIG. 15, the arc sections 506-516 overlap. Therefore, the grooves 502 in overlapping regions will need to be at least twice as deep as those of the first embodiment in order to accommodate the overlap of the cable 104.

In this configuration, the guide 500 can reduce the minimum diameter of the cable reel 100 to 2.07 $R_{min}$. Consequently, for example, if the minimum bend radius $R_{min}$ for a modern optical fibre is 5 mm, then a cable reel having a guide 500 according to the third embodiment of the invention would have a minimum end area of just over 84 mm². This is almost a factor of four smaller than the arrangement shown in FIG. 1.

As set out above, a consequence of utilising more than two arc sections per guide is that the cable 104 has to cross over itself—in at least two places in the case of the third embodiment. This has the implication that the depth of the grooves used to form the guide must vary. A sixth embodiment is shown in FIGS. 16 to 18 in which such cable crossing can be avoided.

Figure 16:
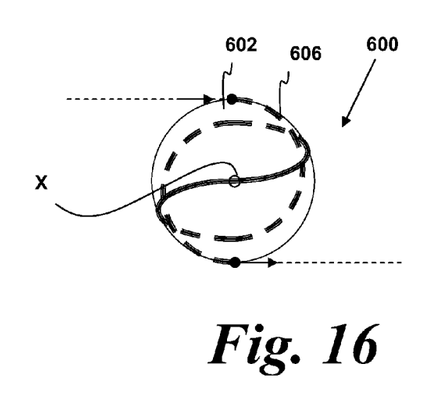
FIG. 16 is a schematic diagram of the end of a sixth embodiment of a guide for use in the cable reel of FIG. 3.
Figure 17:
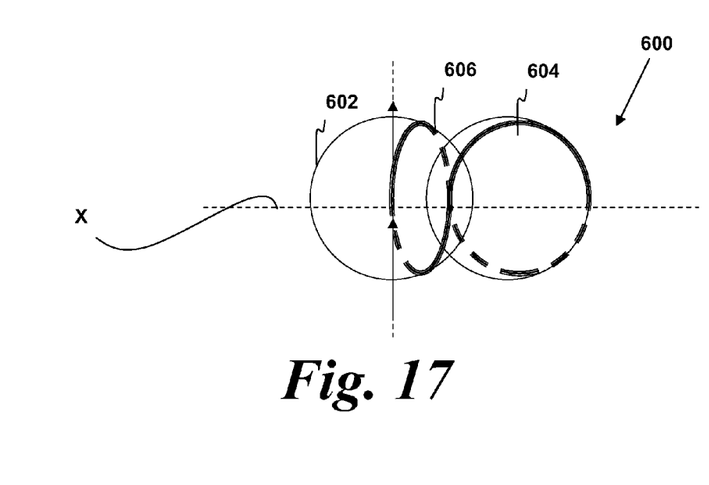
FIG. 17 is a schematic diagram of the plan of the guide shown in FIG. 16.
Figure 18:
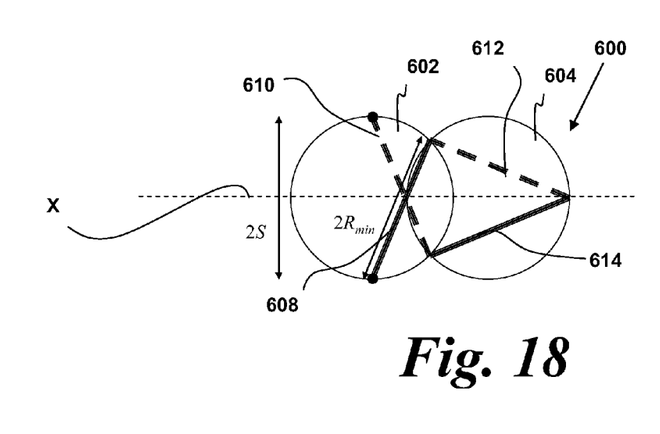
FIG. 18 is a schematic diagram of a side view of the guide shown in FIG. 16.

FIGS. 16 to 18 show a sixth embodiment of the present invention in which a guide 600 is provided in the form of two adjoining spheres 602, 604 comprising grooves 606 therein. The grooves 606 of the guide 600 follow the surface of the spheres 602, 604. FIG. 16 shows an end view of the guide 600 along the axis X (similar to the view of the guide 120 shown in FIG. 3). FIG. 18 shows a side view in a direction along the axes A and B. FIG. 17 shows a top view perpendicular to each of the axes X, A and B.

In this embodiment, the guide 600 comprises four arc sections 608, 610, 612, 614. As before, the arc sections shown in dotted lines denote arc sections on the far side of the spheres 602, 604. As shown in FIGS. 16 to 18, and in contrast to the third and fourth embodiments, there is no overlap between the arc sections 608, 610, 612, 614. This alleviates the requirement for variable-depth grooves as described previously.

As set out previously, the minimum bend radius of the cable 104 is $R_{min}$ and the radius of the spherical guide 600 is S. Consequently, the diameter of the cable reel is, at a minimum, 2S. In this embodiment, the minimum diameter of the spheres 602, 604 comprising the guide 600 is equal to:

$$\frac{4}{\sqrt{2+\sqrt{2}}} R_{min} \approx 2.16 R_{min} \qquad 5)$$

and the dimension along the axis of the spooling cylinder occupied by the route is:

$$(\sqrt{2+\sqrt{2}}+\sqrt{2-\sqrt{2}}) R_{min} \approx 2.61 R_{min} \qquad 6)$$

The guide 600 may be implemented in an appropriate cable reel in a manner similar that shown and described previously with reference to FIG. 7. This arrangement is particularly applicable in situations where the end area of the cable reel is more critical than the width thereof.

Figure 19:
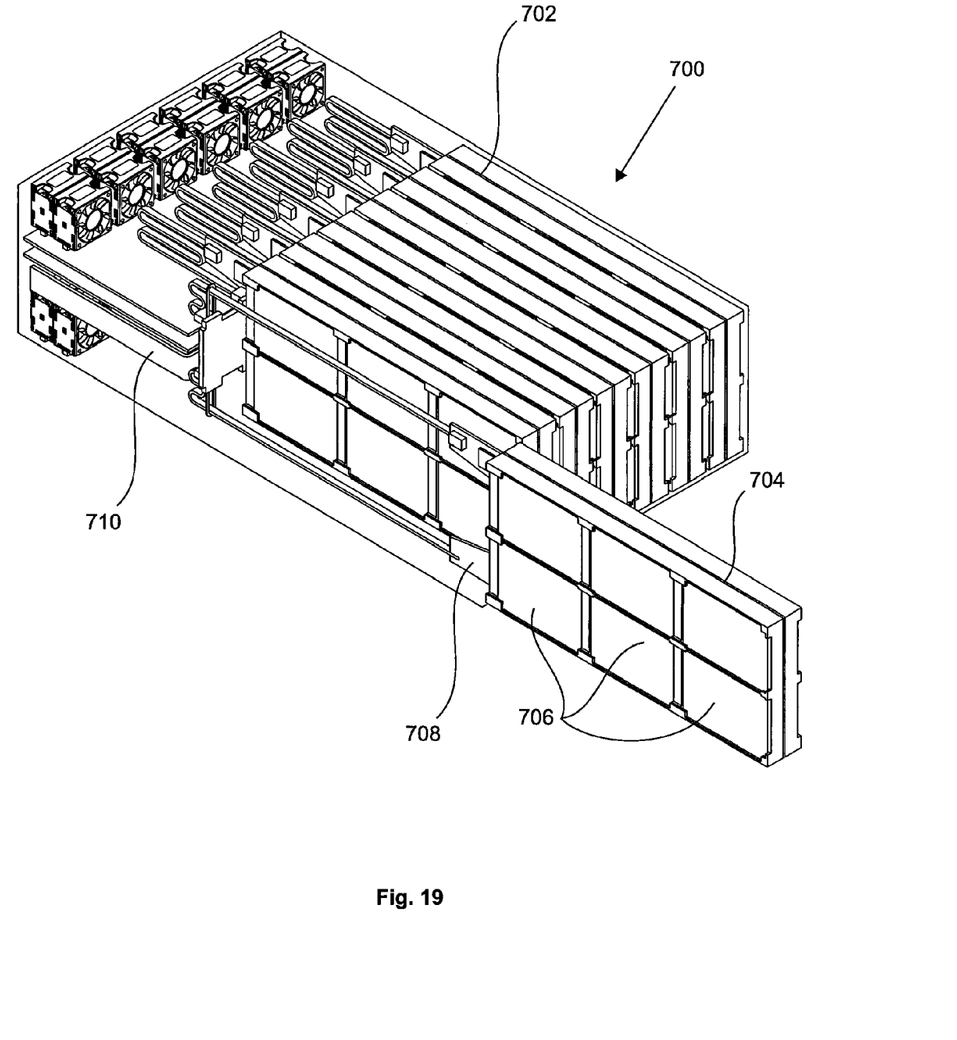
FIG. 19 is an isometric schematic view of a storage system in which the cable reels of FIGS. 3 to 18 may be used.

FIG. 19 shows a possible application of embodiments of the present invention. FIG. 19 shows an isometric view of a storage system 700. The storage system 700 comprises a frame 702 within which is mounted a plurality of movable drawers 704. The drawers 704 may be mounted on rollers (not shown) and can be slid out of the frame 702 as shown in FIG. 19 to permit access to the content of the drawers 704.

A plurality of hard disk drives (HDDs) 706 are located in each drawer 704. In this embodiment, each drawer comprises twelve HDDs 706, with two arrays of six HDDs 706 arranged back to back. An individual HDD 706 can be removed from the storage system 700 by sliding a respective drawer 704 out and disconnecting the HDD 706 in question without affecting the operation of other HDDs 706 in a given drawer 704.

At the rear end of each drawer 704 is provided an interconnect 708 for connecting the HDDs 706 of that drawer 704 to other components of the storage system 700. In this embodiment, the interconnect 708 comprises a parallel optical transceiver attached to the rear end of each drawer 704. The transceiver comprises a parallel optical interface (for example, of the MT or MPO standard) and can accommodate a fibre optic cable such as the cable 104 described previously.

At the rear of the frame 702 is mounted an optical printed circuit board (optical PCB) 710. An optical PCB is a circuit board which includes one or more optical communication layers and will typically include one or more electrical communication and power layers. In some cases, the optical PCB may comprise an optical backplane. The optical PCB 710 comprises optical interconnects and is arranged to connect the storage system 700 to other components of a computer system or a network.

Figure 20:
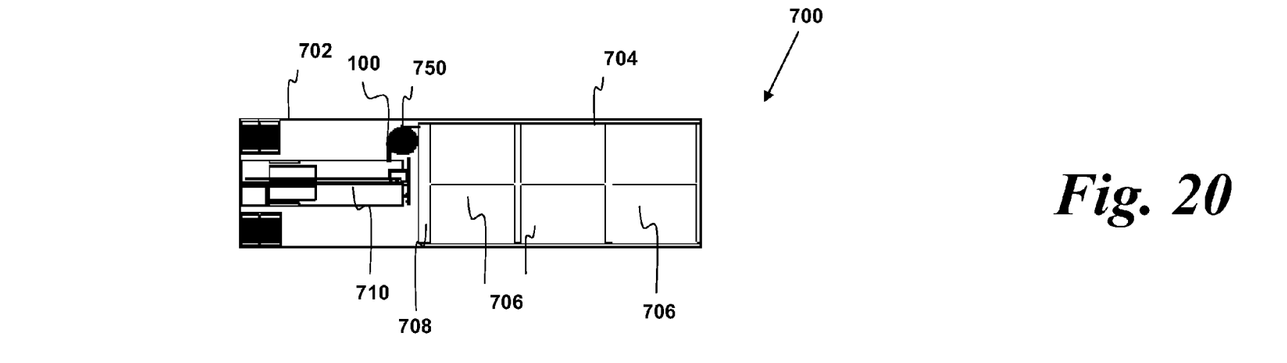
FIG. 20 is a schematic side view of the storage system of FIG. 19 incorporating a cable reel according to the invention and showing a drawer of the storage system in a retracted position.
Figure 21:
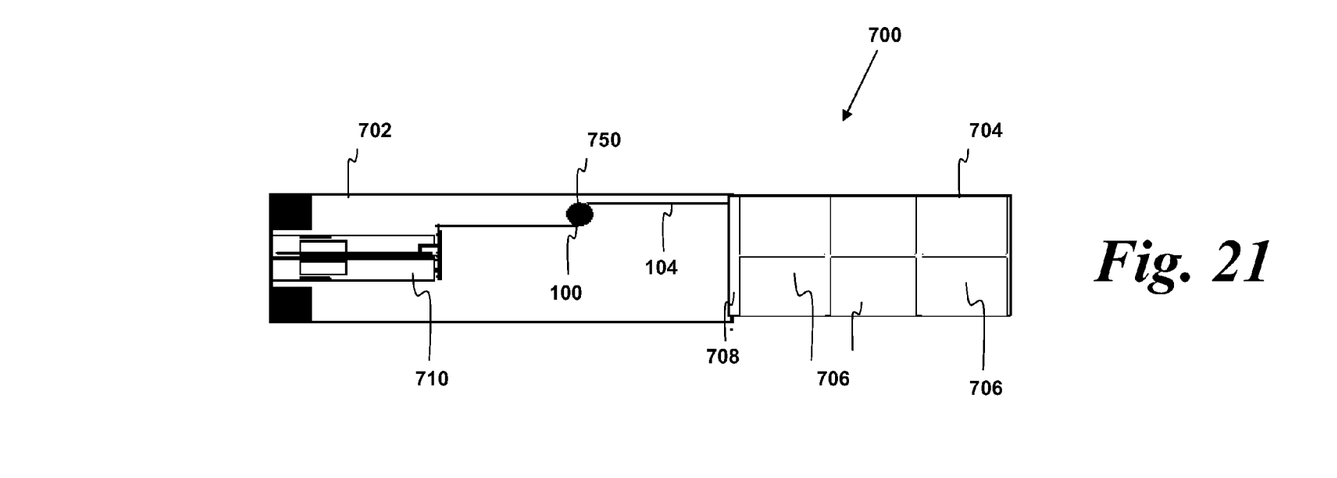
FIG. 21 is a schematic side view of the storage system of FIG. 19 incorporating a cable reel according to the invention and showing a drawer of the storage system in an extended position.

FIGS. 20 and 21 show side schematic views of the storage system 700 comprising a cable reel assembly 750 according to the invention. Only a single drawer 704 is shown in these figures for clarity. In FIG. 20, the drawer 704 is shown retracted into the frame 702 of the storage system 700. In FIG. 21, the drawer 704 is shown extended from the frame 702 in order to facilitate, for example, access to the HDDs 706 contained therein.

A cable reel assembly 750 is shown in FIGS. 20 and 21 and comprises a cable reel 100 arranged to reel thereon a cable 104. The cable reel 100, in combination with any of the described embodiments, could be used in this arrangement. The cable 104 comprises a multimode fibre optic cable which is connected between the interconnect 708 and the optical PCB 710.

The cable reel assembly 750 is arranged to be moveable with the drawer 704 such that, as the drawer 704 is extended, the cable 104 extends from the cable reel 100 in both directions. As the drawer 704 is extended, the cable reel 100 moves (for example, on a slider) away from the optical PCB 710 at a rate which is half of the rate of movement of the drawer 704. Additionally, the cable reel 100 may be spring loaded on its axis to bias the cable reel assembly 100 to reel the cable 104 back in when the drawer 704 is closed.

The arrangement of the present invention enables a cable reel to have a smaller diameter without exceeding the maximum bending requirements of a cable. Therefore, as shown in FIGS. 17 and 18, the reduced space required for the cable reel enables the density of HDDs 706 in a storage system 700 to be increased. Therefore, the information density of the storage system 700 can be increased for a given physical size or footprint.

Variations of the above embodiments will be apparent to the skilled person. The precise configuration of hardware and software components may differ and still fall within the scope of the present invention.

Embodiments of the present invention have been described with particular reference to the examples illustrated. While specific examples are shown in the drawings and are herein described in detail, it should be understood, however, that the drawings and detailed description are not intended to limit the invention to the particular form disclosed. It will be appreciated that variations and modifications may be made to the examples described within the scope of the present invention.

The invention claimed is:

1. A storage reel arrangement for storage of cable, comprising:
 a cable reel, said cable reel being rotatable about an axis and having a surface spaced from said axis, said surface being arranged to store wound cable thereon, the cable reel further comprising:
  a first receiving portion for receiving a first part of the cable;
  a second receiving portion for receiving a second part of the cable; and
  a guide for guiding the cable between the first and second receiving portions, wherein the guide is arranged to guide the cable along a path extending in three dimensions.

2. A storage reel arrangement according to claim 1, wherein the guide is curved.

3. A storage reel arrangement according to claim 2, wherein the guide comprises a plurality of curved portions, each portion being curved in a different direction.

4. A storage reel arrangement according to claim 3, wherein each curved portion lies in a plane.

5. A storage reel arrangement according to claim 4, wherein the plane of each curved portion lies at an angle to the planes of the other curved portions.

6. A storage reel arrangement according to claim 3, wherein at least two curved portions are provided.

7. A storage reel arrangement according to claim 6, wherein at least four curved portions are provided.

8. A storage reel arrangement according to claim 3, wherein each curved portion has a radius of curvature which is equal to or greater than the minimum radius of curvature of said cable.

9. A storage reel arrangement according to claim 1, wherein said guide comprises at least one guide channel.

10. A storage reel arrangement according to claim 9, wherein said guide channel comprises a groove.

11. A storage reel arrangement according to claim 9, wherein said guide channel is formed in a spherical surface.

12. A storage reel arrangement according to claim 11, wherein said spherical surface comprises two spheres adjacent one another.

13. A storage reel arrangement according to claim 1, wherein said guide comprises a tube, said cable being passed through said tube.

14. A storage reel arrangement according to claim 1, wherein said guide forms an end cap on said cable reel.

15. A storage device according to claim 14, wherein said first electronic device comprises an optical printed circuit board and said second electronic device comprises at least one data storage device.

16. A storage device according to claim 15, wherein the or each data storage device comprises a hard disk drive.

17. A storage reel arrangement according to claim 1, wherein said cable comprises a fibre optic cable.

18. A storage device for containing electronic components, said storage device comprising:
 a frame; and
 at least one drawer movable with respect to said frame;
 said frame comprising a first device and said drawer comprising a second device, said first and second devices being connected by cable,
 wherein said cable comprises communication cable and is stored on a storage reel arrangement according to claim 1.

19. A storage reel arrangement for storage of cable, comprising:
 a cable reel, said cable reel being rotatable about an axis and having a surface spaced from said axis, said surface being arranged to store wound cable thereon, the cable reel further comprising:
  a first receiving portion for receiving a first part of the cable;
  a second receiving portion for receiving a second part of the cable; and
  a guide for guiding the cable between the first and second receiving portions, wherein the guide is arranged to guide the cable along a path extending in three dimensions such that the path taken by the guide can be resolved into components parallel to and perpendicular to the axis of rotation of the cable reel.

20. A method of storing cable, comprising:
 providing a cable reel, said cable reel being rotatable about an axis and having a surface spaced from said axis, said surface being arranged to store wound cable thereon, the method further comprising:
 receiving a first part of the cable at a first receiving portion of said cable reel;
 receiving a second part of the cable at a second receiving portion of said cable reel; and
 guiding the cable between the first and second receiving portions, along a path extending in three dimensions.

* * * * *